United States Patent [19]

Matsuo et al.

[11] Patent Number: 5,207,992
[45] Date of Patent: May 4, 1993

[54] SILICON SINGLE CRYSTAL PULLING-UP APPARATUS

[75] Inventors: Shuitsu Matsuo, Atsugi; Kazuo Ito; Masayuki Saito, both of Nishi-Okitama, all of Japan

[73] Assignee: Toshiba Ceramics Co., Ltd., Tokyo, Japan

[21] Appl. No.: 689,333

[22] Filed: Apr. 22, 1991

Related U.S. Application Data

[63] Continuation-in-part of Ser. No. 132,512, Dec. 14, 1987, abandoned.

[30] Foreign Application Priority Data

Dec. 26, 1986 [JP] Japan ................. 61-315576

[51] Int. Cl.$^5$ ............... C30B 35/00; C30B 15/10; C30B 29/06
[52] U.S. Cl. .................. 422/249; 156/617.1; 156/620.3; 156/DIG. 70; 422/248
[58] Field of Search ............... 156/617.1, 620.2, 620.3, 156/DIG. 70; 422/245, 248, 249

[56] References Cited

U.S. PATENT DOCUMENTS

| | | | |
|---|---|---|---|
| 4,198,382 | 4/1980 | Matsui | 423/445 |
| 4,225,569 | 9/1980 | Matsui et al. | 423/445 |
| 4,668,481 | 5/1987 | Watanabe et al. | 156/620.2 |
| 4,686,091 | 8/1987 | Washizuka et al. | 156/620.2 |

FOREIGN PATENT DOCUMENTS

| | | | |
|---|---|---|---|
| 1769860 | 11/1971 | Fed. Rep. of Germany . | |
| 1519794 | 2/1973 | Fed. Rep. of Germany . | |
| 3026049 | 2/1981 | Fed. Rep. of Germany . | |
| 3441707A1 | 5/1986 | Fed. Rep. of Germany . | |
| 0172292 | 10/1983 | Japan | 422/249 |
| 58-181797 | 10/1983 | Japan . | |
| 60-131892 | 7/1985 | Japan | 422/249 |
| 63-166787 | 7/1988 | Japan | 422/249 |
| 63-166790 | 7/1988 | Japan | 422/249 |
| 63-166795 | 7/1988 | Japan | 422/249 |
| 2188854 | 4/1986 | United Kingdom | 422/249 |

*Primary Examiner*—Gary P. Straub
*Attorney, Agent, or Firm*—David G. Conlin; Ernest V. Linek

[57] ABSTRACT

A silicon single crystal pulling-up apparatus includes a silica glass crucible for accommodating a melted silicon material, a cylindrical member made of a carbon composite material which is composed of a carbon fiber wound round a cylinder, impregnated with a resin and carbonized, disposed on an upper end of a cylindrical portion of the crucible for accommodating the melted silicon in association with the cylindrical portion of the crucible, a wall thickness of the cylindrical member being not more than 3 mm, a rotational shaft for rotating the crucible, and a crucible support fixed to an upper end of the rotational shaft for supporting the crucible.

4 Claims, 4 Drawing Sheets

SILICON SINGLE CRYSTAL PULLING-UP APPARATUS

CROSS REFERENCE TO RELATED APPLICATION

The present application is a continuation in part of an application Ser. No. 132,512 filed on Dec. 14, 1987, now abandoned.

BACKGROUND OF THE INVENTION

1. Field of the Invention

This invention relates to a silicon single crystal pulling-up apparatus.

2. Description of the Related Art

A single crystal of silicon used as the material of a substrate for a semiconductor device is produced mainly by Czochralski (CZ) process which produces single crystal ingot of silicon in principle by supporting a crucible rotatably within a chamber, melting a silicon material within the crucible, dipping a seed crystal hung rotatably from above into the surface of the melted silicon, and pulling-up the seed crystal.

A number of very precise temperature controls with respect to a pulling-up of the silicon single crystal are requested recently. For example, they are a control of heat history received by a pulled up crystal, a delicate thermal control on a solid liquid interface and a total temperature control of liquid and so on. Uniformity of concentration of oxygen and resistivity in the crystal can be obtained by the above mentioned controls.

The crucible support of the conventional silicon single crystal pulling-up apparatus comprises a rotational shaft extending into the chamber from a lower opening in the chamber and a crucible-shaped protector of isotropic carbon (so called carbon crucible) fixed at an upper end of the rotational shaft. A crucible of silica glass is accommodated within the protector. The carbon crucible is thick enough to prevent thermal deformation of the crucible.

The conventional carbon crucible covers the entire silica glass crucible with the same material so that both the coefficients of thermal expansion of those materials are required to be similar to each other. Therefore, only isotropic carbon having a particular physical property can be used; namely, the kinds of selectable material are limited. The conventional carbon crucible is produced by drilling an isotropic carbon block, so the producing cost is high. In addition, such isotropic carbon block discharge a large amount of occluded gas from its pores to pollute the silicon single crystal and adversely affect the physical properties of the silicon single crystal.

The carbon crucible has means for preventing its breakage, for example, preventing a stress concentration by dividing its body into, for example, three parts. However, its service life is not necessary long, the crucible must be exchanged after about twenty times of use and therefore the running cost is expensive.

The silica glass crucible is covered with the thick carbon crucible, so that its thermal response to a change in the output of the heater is low, and it is difficult to rapidly control the temperature of the melted silicon. This problem has come more noticeable as the diameter of the crucible becomes larger.

SUMMARY OF THE INVENTION

This invention has been made to solve above problems. It is an object of this invention to provide a silicon crystal pulling-up apparatus which reduces the running cost.

According to this invention, the above object is achieved by a silicon single crystal pulling-up apparatus comprising, a silica glass crucible for accommodating a melted silicon material, a cylindrical member made of a carbon composite material which is composed of a carbon fiber wound round a cylinder, impregnated with a resin and carbonized, and disposed on an upper end of a cylindrical portion of the crucible for accommodating the melted silicon in association with the cylindrical portion of the crucible, wall thickness of the cylindrical member being not morr than 3 mm, a rotational shaft for rotating the crucible, and a crucible support fixed to an upper end of the rotational shaft for supporting the crucible.

The cylindrical member according to this invention is made of a carbon composite material which is composed of a carbon fiber or a silicon carbide fiber wound round a cylinder (wound in one layer or in not less than two layers round a cylinder when a diameter of the fiber is small), impregnated with a resin and carbonized, then the cylindrical member of the carbon composite with a sufficient strength can be obtained.

When the above cylindrical memberwith a wall thickness not more than 3 mm (preferably not more than 2 mm) is disposed on an upper end of the cylindrical portion of the crucible for accommodating the melted silicon in association with the cylindrical portion of the crucible, heat capacity of the cylindrical member itself can become smaller and heat response to temperature control for the melted silicon can be extremely improved. Therefore, the high quality crystal with less defect due to thermal variation can be obtained. The cylindrical member has a exceeding strength against a stress causing the cylindrical member to expand in a diametral direction of the cylindrical member, then the cylinder member has a sufficient intensity to prevent flow accident of melted silicon due to softening and spreading to the diametrical direction thereof upon pulling-up of the silicon.

The cylindrical member made of such carbon composite member reduces its producing cost and has a mechanical strength enough to be difficult to break.

The cylindrical member does not substantially discharge its occluded gas and reduces an adverse influence on the physical properties of the silicon single crystal. In addition, it is unnecessary to pay great attention to the difference in coefficient of thermal expansion between the crucible support and the crucible. The cylindrical member may be made of not only isotropic carbon, but also burnt silicon nitride or burnt silicon carbide coated with a silicon nitride film.

The material of the crucible support according to this invention is, preferably, isotropic carbon, sintered silicon nitride or sintered silicon carbide coated with a silicon nitride film, for example, to thereby reduce further the emission of gas occluded in the crucible support.

In addition, since a wall thickness of the cylindrical member according to this invention is not more than 3 mm, and since the cylindrical member can be considerably thinned so that its thermal response is high, thereby it is possible to heat quickly the crucible and to permit rapid temperature control of the surface of the melted silicon in response to a change in the output of the heater in comparison with the ordinary crucible.

DESCRIPTION OF THE PREFERRED EMBODIMENT

Embodiment of the apparatus according to this invention will now be described with reference to the drawings.

The embodiment to be described below is a mere means which will bring about a clear understanding of the invention. Various changes and modifications could be made by those skilled in the art without departing from the scope of this invention defined clearly in the claims.

Figure 1:
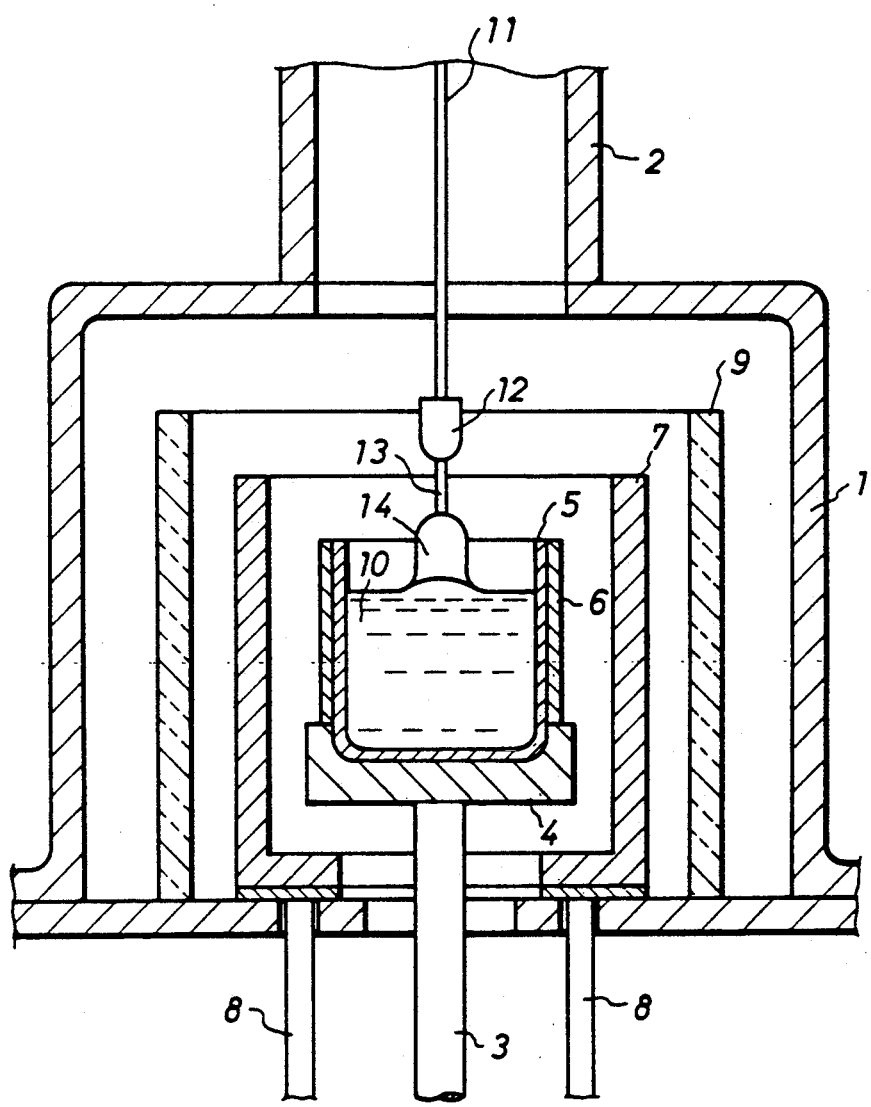
FIG. 1 is a cross section view of a silicon single crystal pulling-up apparatus.

In FIG. 1, a chamber 1 has a pull chamber 2 at its upper end. A rotational shaft 3 extends into the chamber 1 through a lower opening in the chamber 1 and has fixed at its upper end a crucible support 4 of isotropic carbon. Placed on the support 4 are a silica glass crucible 5 and a cylindrical member 6 covering an outer surface of a cylindrical portion of the crucible 5. The cylindrical member 6 is made of a carbon composite member which is composed of a carbon fiber wound around a cylinder and impregnated with a resin and carbonized. A wall thickness of the cylindrical member 6 is thinner than a thickness of the crucible support 4 in a vertical direction thereof. A diameter of the carbon fiber is not more than 3 mm. The cylindrical member 6 is surrounded by a cylindrical carbon heater 7 which is connected with electrodes 8 extending through an opening disposed in a bottom of the chamber 1. The heater 7 is in turn surrounded by a cylindrical heat insulator 9. A heat insulator 9, for example, of carboneceous ceramic form or a mutiplicity of cylindrically disposed upstanding silica glass tubes is preferably provided between the heater 7 and the chamber 1 to improve the thermal efficiency of the heater 7.

The pulling-up of silicon single crystal ingot is performed using the above silicon pulling-up apparatus as follows. A polycrystal silicon material is filled into the crucible 5, the heater 7 is powered to melt the material within the crucible 5, and a seed crystal 13 fixed by a seed chuck 12 to a lower end of a pulling-up shaft 11 is hung from above the pull chamber 2, dipped into melted silicon 10, and pulled up to produce silicon single crystal ingot 14.

In the apparatus, the cylindrical member 6 surrounding the cylindrical portions of the crucible 5 is made of a carbon composite member of horizontally wound carbon fibers, etc., accordingly the producing cost of the cylindrical member 6 is low. The cylindrical member 6 has a mechanical strength enough to be difficult to break. When only one of the cylindrical member 6 or the crucible support 4 is broken, only said broken one is required to be changed, so that the running cost is low.

The cylindrical member 6 discharges little occluded gas. Isotropic carbon which poses an occluded gas problem is used only to constitute the crucible support 4, so that an adverse influence on the physical properties of the silicon single crystal is reduced. It is unnecessary to pay great attention to the difference in coefficient of thermal expansion between the crucible support 4 and the crucible 5. The crucible support 4 may be made of sintered silicon nitride or sintered silicon carbide coated with a silicon nitride film thereby to reduce the discharge of the occluded gas.

The cylindrical member 6 covering the cylindrical portion of the crucible 5 is thin, so that its thermal response is high to thereby permit rapid temperature control of the melted silicon 10 in response to a change in the output of the heater 7. Therefore, the characteristics of the silicon single crystal is improved.

Figure 2:
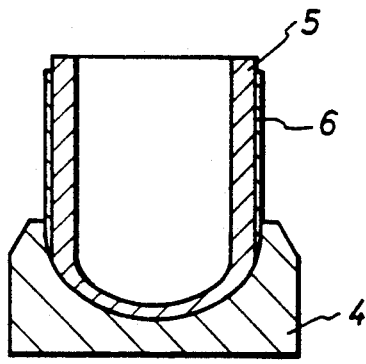
FIG. 2 is a cross section view of another crucible, cylindrical member and crucible support.

As shown in FIG. 2, the cylinder member 6 covering the outer surface of the cylindrical portion of the crucible 5 may be imbeded at its lower end into the crucible support 4.

The crucible 5 may take various shapes and not limited to that shown in FIGS. 1 and 2. It may take the form of a taper increasingly divergent upwardly. In this case, the cylindrical member 6 may take a form corresponding to the shape of the crucible 5.

Figure 3:
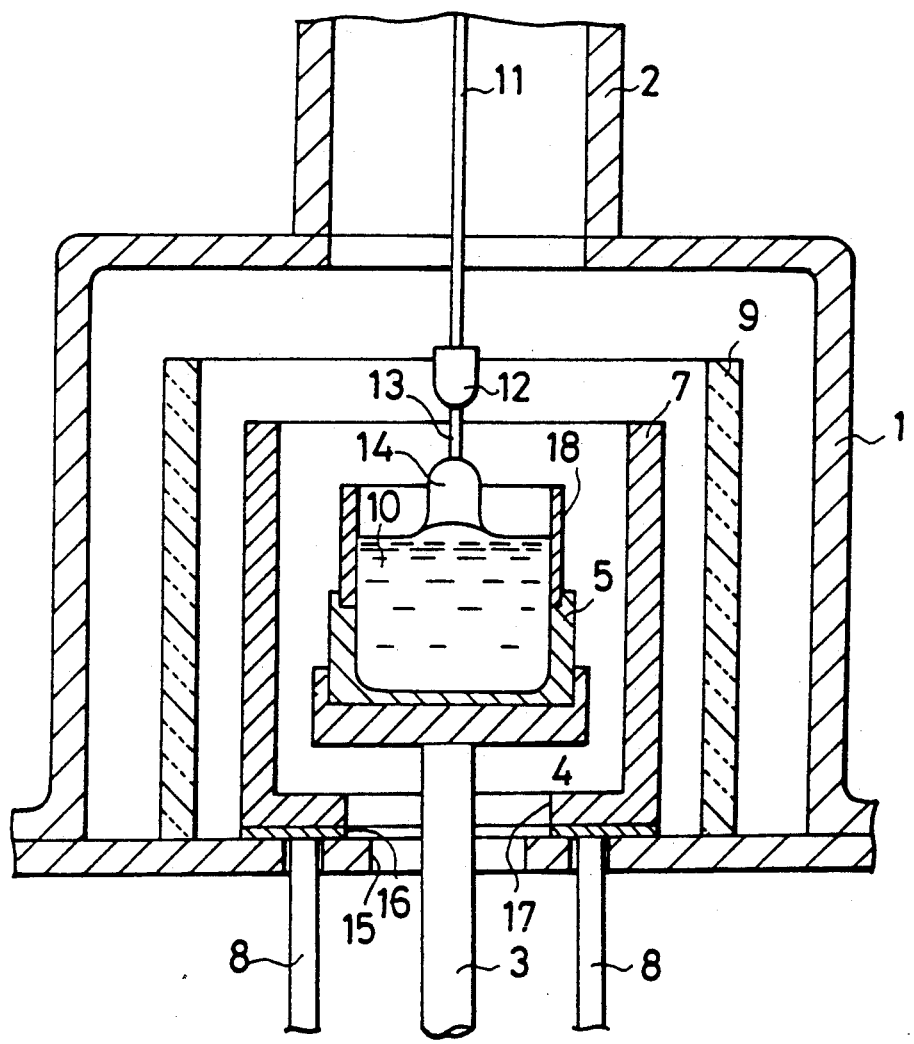
FIG. 3 is a cross section view of an embodiment of the silicon single crystal pulling-up apparatus according to the invention.

In FIG. 3, an embodiment of the invention is shown. A difference between the embodiment of the invention and the silicon single crystal pulling-up apparatus shown in FIGS. 1 or 2 exists in the cylindrical member. The cylindrical member 18 in FIG. 3 is disposed on an upper end of the cylindrical portion of the crucible 5 along the upper end of the cylindrical portion for accommodating the melted silicon in association with the cylindrical portion of the crucible. In more detail, the cylindrical member 18 is at a lower end thereof fitted into a recess formed on an inner circumferential wall of the upper end of the cylindrical portion of the crucible 5. The wall thickness of the crucible 18 is about 20 mm but that of the cylindrical member 18 is not more than 3 mm, preferably not more than 2 mm. The rotational shaft 3 extends into the chamber 1 through openings 15, 17, 16 respectively disposed in the bottoms of the chamber 1, the heater 7 and in a spacer disposed between the bottoms of the heater 7 and the chamber 1.

Example

The experimental results of the invention will be described with reference to FIG. 4 in comparing with the general apparatus.

The experiments on the pulling-up of the silicon are performed at three times using the following apparatus.

(I) Hot-zone constructions

|  | general apparatus | embodiment of the invention |
|---|---|---|
| (a) size of carbon crucible | | |
| outer diameter | 445 mm | 445 mm |
| inner diameter | 406 mm | 406 mm |
| height | 310 mm | 195 mm |
| (b) height of cylindrical member | cylindrical member is unused | 120 mm |
| (c) carbon insulator (12 divided type) | used | used (same as left) |

(II) Pulling-up conditions on general apparatus and embodiment of the invention

| | |
|---|---|
| seed | diameter 5 mm |
| | P: (100), ρ: 18–25 |
| Poly-Si | 25 KG (A Virgin) |
| SR/CR | 15/5 rpm |
| CP | +27 mm |
| Ar | 100 l/min |
| press.in chamber | 20 Torr |

(III) Results (1) Si in each of the crucibles of the general apparatus and the embodiment of the invention was melted by the heater set at a temperature of 1600° C. The required times to melt the silicon were 2 hours and 34 minutes in the embodiment and 3 hours and 3 minutes in the general apparatus. Therefore, since the crucible and the cylindrical member according to the invention has the heat capacity less than that of the general apparatus, it can melt the silicon at the time shorter than that of the general apparatus.

Figure 4:
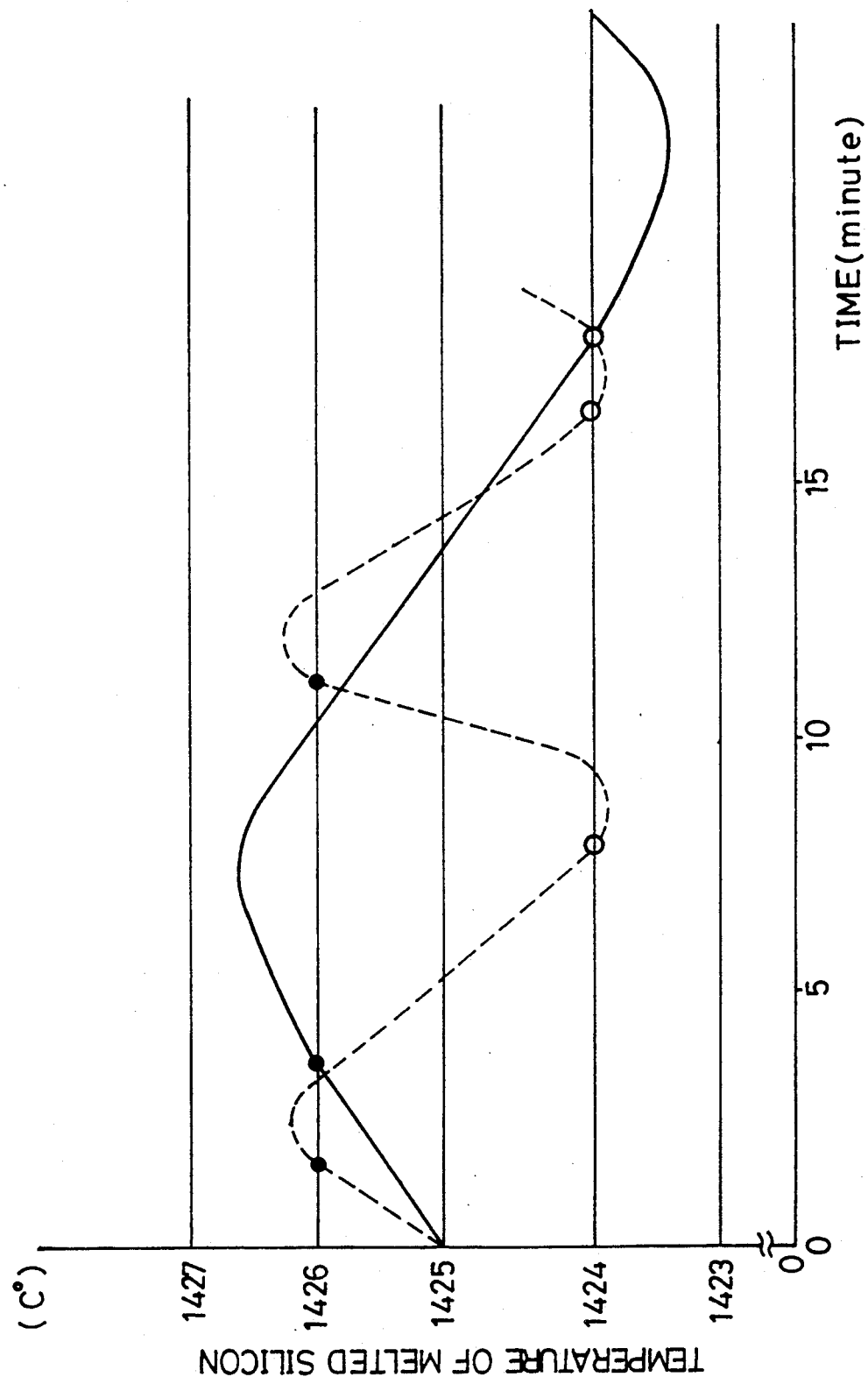
FIG. 4 is a temperature-time chart on the melted silicon accommodated in the crucible and the cylindrical member.

(2) In FIG. 4, a response characteristic on the temperature of the melted silicon is shown. In FIG. 4, an x axis represents an elapse time (minute) and a y axis does the temperature (°C.) of the melted silicon. And a dotted line indicates a temperature-time curve on the embodiment of the invention and a continuous line does a temperature-time curve on the general apparatus. A thermo couple is arranged in the melted silicon at a position apart 5 cm from an inner side wall of the cylindrical member or the crucible and 2 cm in depth from the melted silicon surface. And the thermo couple is connected to a controller for controlling the temperature of the heater and to the heater to measure a variation of the temperature of the melted silicon within 1425° C.±1° C. The controller controls the output of the heater such that the output of the heater is reduced by 5% when the temperature of the melted silicon is reached to 1426° C. (at each of black dots on the both curves in FIG. 4) and the output is increased by 5% when the temperature is reached to 1424° C. (at each of white dots on the both curves in FIG. 4). As seen from FIG. 4, the temperature-time curve on the embodiment has an extreme gradient and has over-shooting parts (protrusions beyond 1426° C. and below 1424° C. on the curves) less than that of the general apparatus. That is, the quick response to the output of the heater can be smoothly performed. Therefore, it is possible to rapidly set the temperature of the melted silicon to a predetermined value even though any control system is adapted.

What is claimed is:

1. A silicon single crystal pulling-up apparatus comprising:

a silica glass crucible for accommodating a melted silicon material;

a cylindrical member made of a carbon composite material which is composed of a carbon fiber with a diameter not more than about 3 mm wound in a shape of cylinder in one layer, impregnated with a resin and carbonized, said member being in contact with and covering the outer side surface of a cylindrical portion of said crucible, the wall thickness of said cylindrical member being not more than about 3 mm;

a rotational shaft for rotating said crucible; and a crucible support fixed to an upper end of said rotational shaft for supporting said crucible.

2. A silicon single crystal pulling-up apparatus according to claim 1, in which said diameter of said carbon fiber is not more than about 2 mm, and said wall thickness of said cylindrical member is not more than about 2 mm.

3. A silicon single crystal pulling-up apparatus according to claim 1, in which said cylindrical member is located above said crucible support and is located under the upper end of said crucible.

4. A silicon single crystal pulling-up apparatus according to any one of claims 1 to 3, in which said crucible support is made from carbon, sintered silicon nitride or sintered silicon carbide coated with a silicon nitride film.

* * * * *